(12) United States Patent
Suzuki

(10) Patent No.: US 8,981,675 B2
(45) Date of Patent: Mar. 17, 2015

(54) VOLTAGE MONITORING CIRCUIT

(71) Applicant: Nihon Kohden Corporation, Shinjuku-ku, Tokyo (JP)

(72) Inventor: Tetsuo Suzuki, Tokyo (JP)

(73) Assignee: Nihon Kohden Corporation, Tokyo (JP)

( * ) Notice: Subject to any disclaimer, the term of this patent is extended or adjusted under 35 U.S.C. 154(b) by 35 days.

(21) Appl. No.: 13/735,142

(22) Filed: Jan. 7, 2013

(65) Prior Publication Data
US 2013/0229131 A1    Sep. 5, 2013

(30) Foreign Application Priority Data
Mar. 2, 2012    (JP) .................................. 2012-046318

(51) Int. Cl.
*G05F 1/10* (2006.01)
*H05B 37/02* (2006.01)
*H02M 1/06* (2006.01)
*H02M 1/00* (2006.01)

(52) U.S. Cl.
CPC *G05F 1/10* (2013.01); *H05B 37/02* (2013.01); *H02M 2001/0022* (2013.01)
USPC ............................ 315/307; 315/291; 323/234

(58) Field of Classification Search
CPC ........... H05B 33/0815; H05B 41/3927; H05B 41/28; H05B 33/0818; H05B 41/2828; H05B 33/0827; H05B 39/029; B23K 9/0671; B23K 9/07323; B23K 9/1012; B23K 9/1013; G05F 1/10

USPC ......... 315/307, 278, 291, 297, 301, 302, 306; 323/324–303; 363/74
See application file for complete search history.

(56) References Cited

U.S. PATENT DOCUMENTS

| | | | |
|---|---|---|---|
| 2012/0229111 A1* | 9/2012 | Serdarevic | 323/282 |
| 2013/0313985 A1* | 11/2013 | Choi et al. | 315/192 |
| 2014/0036865 A1* | 2/2014 | Camarda et al. | 370/330 |
| 2014/0063865 A1* | 3/2014 | Nate | 363/21.13 |

FOREIGN PATENT DOCUMENTS

| | | |
|---|---|---|
| JP | 52-040740 | 10/1977 |
| JP | 62-031370 B | 7/1987 |
| JP | 6-284715 A | 10/1994 |

* cited by examiner

*Primary Examiner* — Dylan White
(74) *Attorney, Agent, or Firm* — Sughrue Mion, PLLC

(57) ABSTRACT

A voltage monitoring circuit includes: a ripple filter configured to output an output voltage from which a ripple component included in an input voltage, which is input from a voltage source, has been removed; a load configured to operate with the output voltage as a supply voltage and output a first signal through the operation; a comparator configured to compare an electric potential of the output voltage with an electric potential of the first signal and output a second signal when the electric potential difference is equal to or less than a predetermined threshold value; and a control circuit configured to reduce the electric potential of the first signal under the condition that the second signal is input thereto.

4 Claims, 3 Drawing Sheets

VOLTAGE MONITORING CIRCUIT

BACKGROUND OF THE INVENTION

The present invention relates to a circuit that monitors a power supply voltage supplied to a load through a constant voltage circuit including a ripple filter.

The constant voltage circuit is used in order to supply a constant power supply voltage (load voltage) to a load even if the voltage input from the voltage source changes due to various factors. In order for the constant voltage circuit to operate normally, the input voltage should be higher than the load voltage (output voltage).

In each product, there is a variation of a few percent in the input and output voltage characteristics of the constant voltage circuit. Accordingly, in order to operate the constant voltage circuit normally even if the output voltage is at the upper limit of the range of variation, the input voltage value needs to be set high in order to have a margin. This means that power consumption in the constant voltage circuit is increased and accordingly efficiency is lowered.

For example, the constant voltage supply function may also be obtained by using the ripple filter disclosed in Patent References 1 to 3. Since the ripple filter is configured to remove a high-frequency fluctuation component included in the voltage supplied from the voltage source, it is possible to obtain approximately the same output voltage as the input voltage. Since the above-described high input voltage setting is not necessary, power consumption is low.

(Patent Reference 1) JP-A-6-284715
(Patent Reference 2) JP-B-62-31370
(Patent Reference 3) JP-B-52-40740

When another load, through which a large current flows, is connected to the voltage source, the operation of the load may cause a drop in the input voltage supplied to the ripple filter. Since the ripple filter is not configured to eliminate a variation in the electric potential due to the drop in input voltage, the output voltage becomes a voltage given by removing a ripple component from the input voltage after the drop.

That is, the output voltage from the ripple filter may be lower than the power supply voltage that a load, connected to the ripple filter, requires. In this case, the load cannot perform a predetermined operation.

SUMMARY

This invention provides a voltage monitoring circuit that allows a load, to which the power supply voltage from a ripple filter is supplied, to operate normally even if a drop in the input voltage supplied to the ripple filter occurs.

It is therefore an aspect of the invention to provide a voltage monitoring circuit including:

a ripple filter configured to output an output voltage from which a ripple component included in an input voltage, which is input from a voltage source, has been removed;

a load configured to operate with the output voltage as a supply voltage and output a first signal through the operation;

a comparator configured to compare an electric potential of the output voltage with an electric potential of the first signal and output a second signal when the electric potential difference is equal to or less than a predetermined threshold value; and a control circuit configured to reduce the electric potential of the first signal under the condition that the second signal is input thereto.

According to such a configuration, when the electric potential of the output voltage of the ripple filter drops and the electric potential difference between the electric potential of the output voltage of the ripple filter and the electric potential of the output signal of the load is equal to or less than a predetermined threshold value, the control circuit receives a detection signal from the comparator and actively reduces the electric potential of the output signal of the load. As a result, the electric potential of the output signal of the load drops until the electric potential difference between the electric potential of the output voltage of the ripple filter and the electric potential of the output signal of the load exceeds the threshold value. Accordingly, since the inoperable state of the load is avoided or immediately eliminated, it is possible to maintain the operation of the load even if the state of the power supply voltage dropping continues.

The load may include a signal generating circuit configured to generate a predetermined input signal and an amplifier circuit configured to amplify the input signal to output the first signal, and the control circuit is configured to reduce at least one of an electric potential of the input signal and a gain of the amplifier circuit.

The load may include a driving circuit configured to output a driving signal to make a light emitting element emit a predetermined amount of light and an amplifier circuit configured to amplify an output signal from a light receiving element, which is output corresponding to the amount of light received from the light emitting element, and the control circuit is configured to reduce at least one of an electric potential of the driving signal and a gain of the amplifier circuit.

This configuration is suitable for a case where the light emitting element and the light receiving element are used especially for the acquisition of a biological signal for which the continuity of measurement is requested, for example, it is suitable for a pulse oximeter.

DETAILED DESCRIPTION OF EMBODIMENTS

Embodiments of the invention will be described in detail below while referring to the accompanying drawings.

Figure 1:
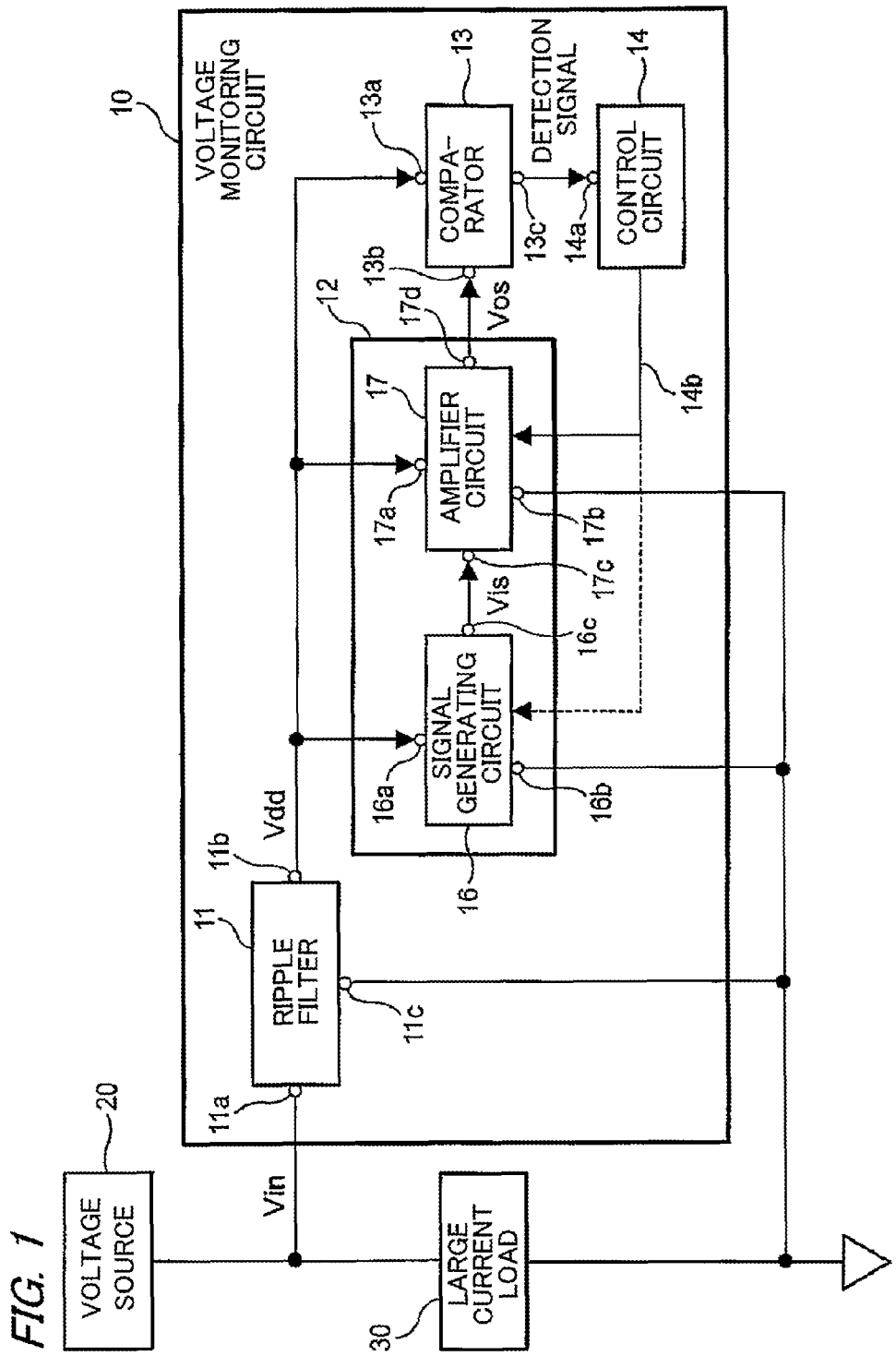
FIG. 1 is a functional block diagram showing the configuration of a voltage monitoring circuit according to a first embodiment of the invention.

FIG. 1 is a functional block diagram showing the configuration of a voltage monitoring circuit 10 according to a first embodiment of the invention. The voltage monitoring circuit 10 includes a ripple filter 11, a load 12, a comparator 13, and a control circuit 14.

A voltage source 20 rectifies an AC voltage supplied from a commercial power supply or the like and supplies it as an input voltage Vin. In the present embodiment, 3.1 V is set as the rated electric potential of the input voltage Vin.

A large current load 30 is inserted between the voltage source 20 and ground. The large current load 30 is a load that consumes a relatively large amount of power when performing a predetermined operation with the power supply voltage supplied from the voltage source 20.

The ripple filter 11 has an input terminal 11a and an output terminal 11b. The input terminal 11a is electrically connected to the voltage source 20, so that the input voltage Vin is input. The ripple filter 11 is grounded through a ground terminal 11c.

Figure 2:
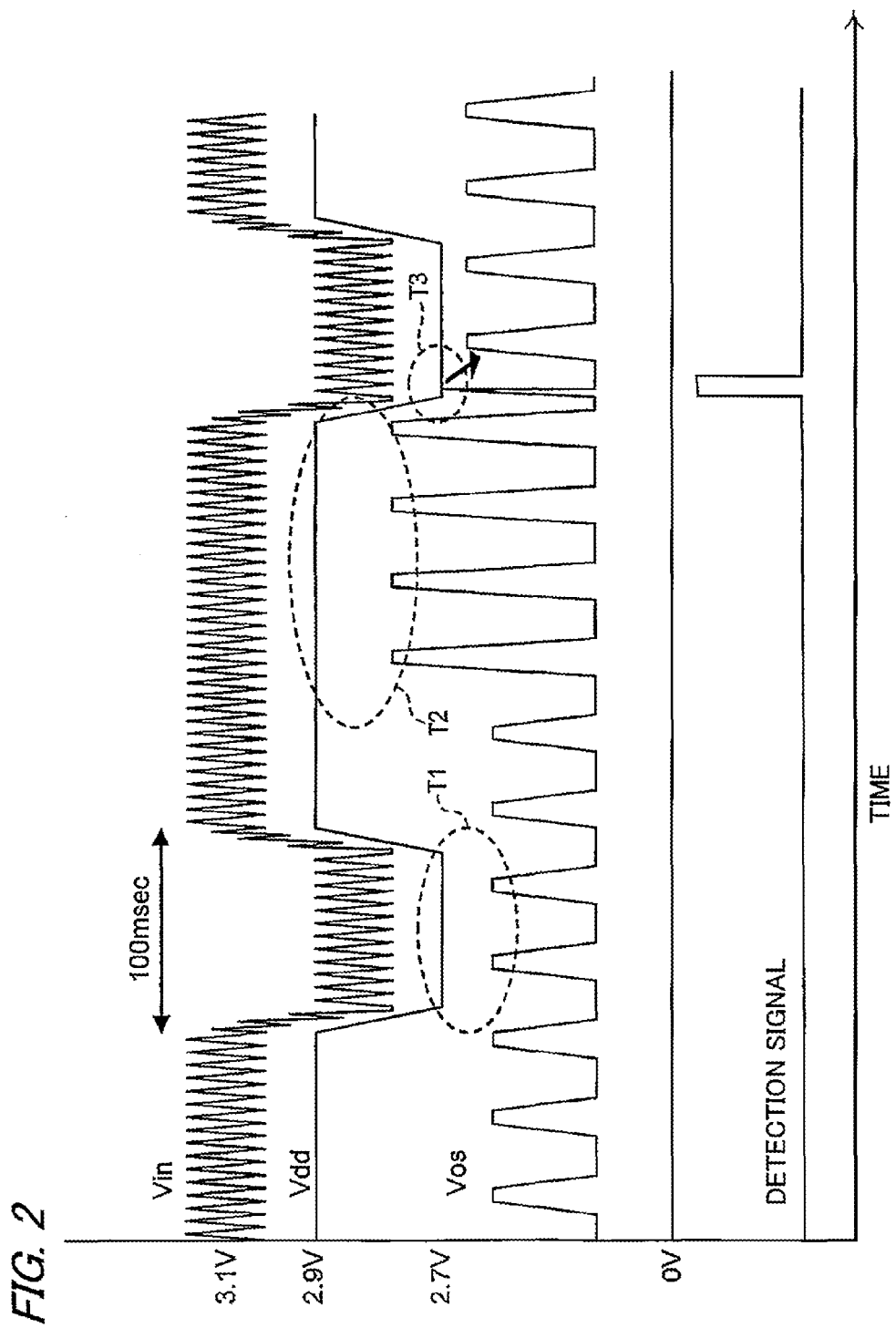
FIG. 2 is a view for explaining the operation of the voltage monitoring circuit shown in FIG. 1.

As shown in FIG. 2, the input voltage Vin supplied from the voltage source 20 includes a ripple component. The ripple filter 11 has a known circuit configuration to remove this ripple component. From the output terminal 11b of the ripple filter 11, an output voltage Vdd is output after the ripple component included in the input voltage Vin is removed.

The ripple filter 11 is configured to output the output voltage Vdd whose electric potential is lower than that of the input voltage Vin by 0.2 V. When 3.1 V of rated electric potential is input, the electric potential of the output voltage Vdd is 2.9 V.

The load 12 operates with the output voltage Vdd as its power supply voltage, and includes a signal generating circuit 16 and an amplifier circuit 17. The output voltage Vdd is input to a power supply terminal 16a of the signal generating circuit 16 and a power supply terminal 17a of the amplifier circuit 17. The signal generating circuit 16 and the amplifier circuit 17 are grounded through ground terminals 16b and 17b, respectively.

The signal generating circuit 16 has a known circuit configuration to generate a predetermined input signal and output the input signal through an output terminal 16c. The input signal generated by the signal generating circuit 16 is input to a signal input terminal 17c of the amplifier circuit 17.

The amplifier circuit 17 has a known circuit configuration to amplify the electric potential Vis of the input signal input to the signal input terminal 17c with a predetermined gain and output an output signal having an electric potential Vos as a first signal of the invention through a signal output terminal 17d. The output signal is used as an output of the load 12 for a desired application.

As shown in FIG. 2, when the large current load 30 operates and a relatively large current flows accordingly, the electric potential of the input voltage Vin supplied from the voltage source 20 drops to approximately 2.9 V for 100 msec, for example. As a result, the electric potential of the output voltage Vdd output from the ripple filter 11 also drops to approximately 2.7 V.

On the other hand, the electric potential Vos of the output signal of the amplifier circuit 17 changes according to the electric potential Vis of the input signal. However, the electric potential Vos of the amplified signal cannot exceed the power supply voltage Vdd supplied from the ripple filter 11.

In a time region indicated by T1 in FIG. 2, a drop in the power supply voltage Vdd due to the operation of the large current load 30 occurs. However, since the highest electric potential of the electric potential Vos of the output signal of the amplifier circuit 17 is lower than the electric potential of the power supply voltage Vdd, there is no problem in the operation of the amplifier circuit 17.

In a time region indicated by T2 in FIG. 2, since the electric potential Vis of a signal input to the amplifier circuit 17 is high, the electric potential Vos of the output signal is also high. In this case, since a drop in the power supply voltage Vdd does not occur, the highest electric potential of the electric potential Vos of the output signal is lower than the electric potential of the power supply voltage Vdd. Accordingly, there is also no problem in the operation of the amplifier circuit 17.

In a time region indicated by T3 in FIG. 2, a drop in the power supply voltage Vdd due to the operation of the large current load 30 occurs again. At this time, if the amplifier circuit 17 tries to output a signal having the same electric potential as that in the time region T2, the highest electric potential of the electric potential Vos of the output signal of the amplifier circuit 17 exceeds the electric potential of the power supply voltage Vdd. In this case, the amplifier circuit 17 cannot operate normally, and this inoperable state is maintained as long as the state, where the highest electric potential of the electric potential Vos of the output signal of the amplifier circuit 17 exceeds the electric potential of the power supply voltage Vdd, continues.

In order to solve this problem, the voltage monitoring circuit 10 of the present embodiment configured to input the output voltage Vdd of the ripple filter 11 to a first input terminal 13a of the comparator 13 and also input an output signal as the first signal of the invention, which is output from the amplifier circuit 17, to a second input terminal 13b of the comparator 13.

The comparator 13 has a known circuit configuration to output a detection signal as a second signal of the invention from an output terminal 13c when the electric potential difference between the first and second input terminals 13a and 13b is equal to or less than a predetermined threshold value.

In the present embodiment, the above threshold value is set to 30 mV. That is, the comparator 13 compares the electric potential Vdd of the output voltage of the ripple filter 11 with the electric potential Vos of the output signal of the load 12, and outputs a detection signal when the electric potential difference is equal to or less than 30 mV.

The detection signal output from the comparator 13 is input to an input terminal 14a of the control circuit 14. The control circuit 14 is configured to reduce the gain of the amplifier circuit 17 through a control line 14b when a detection signal is input to the input terminal 14a.

That is, in the time region T3 shown in FIG. 2, when the electric potential Vdd of the output voltage of the ripple filter 11 drops due to the operation of the large current load 30 and the electric potential difference between the electric potential Vdd and the electric potential Vos of the output signal of the amplifier circuit 17 is equal to or less than 30 mV, the control circuit 14 receives a detection signal from the comparator and reduces the gain of the amplifier circuit 17 actively. The gain reduction is performed through feedback control until no detection signal is input from the comparator 13.

As a result, as shown in FIG. 2, the electric potential Vos of the output signal of the amplifier circuit 17 drops until the electric potential difference between the electric potential Vos and the electric potential Vdd of the power supply voltage exceeds the threshold value (30 mV). Therefore, the inoperable state of the amplifier circuit 17 is avoided or immediately eliminated. Although the gain is reduced from the predetermined value, it is possible to maintain the operation of the amplifier circuit 17 even if the state of the power supply voltage dropping continues.

Next, a voltage monitoring circuit 10A according to a second embodiment of the invention will be described with reference to FIG. 3. The same reference numbers are given to substantially the same or similar configurations as in the first embodiment, and repeated explanation will be omitted.

The voltage monitoring circuit 10A of the present embodiment is different from the voltage monitoring circuit 10 of the first embodiment in that a light emitting circuit 18 and a light receiving circuit 19 are provided as two loads.

The light emitting circuit 18 includes a light emitting element capable of emitting light beams having a plurality of wavelengths, which are transmitted through or reflected by body tissue, and a driving circuit for driving the light emitting element. The light receiving circuit 19 includes a light receiving element, which outputs a signal corresponding to the amount of transmitted light or reflected light from the light emitting element, and an amplifier circuit, which amplifies the output signal from the light receiving element.

That is, the light emitting circuit 18 and the light receiving circuit 19 form a part (signal processing section) of a pulse oximeter that makes light beams having a plurality of wavelengths, of which absorption characteristics with respect to target substances such as oxygenated hemoglobin are different, transmitted through or reflected from body tissue and calculates the oxygen saturation in arterial blood from pulse wave data signals acquired by measuring the amount of received light continuously. The light emitting element and the light receiving element are configured as a probe, and they can be attached to a signal processing section through a connector and be detached from the signal processing section.

The light emitting circuit 18 operates with the output voltage Vdd of the ripple filter 11, which is input to a power supply terminal 18a, as its power supply voltage, and the driving circuit generates a driving signal having an electric potential corresponding to the amount of emitted light of the light emitting element and outputs the driving signal to the light emitting element. The light emitting circuit 18 is grounded through a ground terminal 18b.

The light receiving circuit 19 operates with the output voltage Vdd of the ripple filter 11, which is input to a power supply terminal 19a, as its power supply voltage, and the amplifier circuit amplifies a signal having an electric potential corresponding to the amount of received light of the light receiving element and outputs the amplified signal through an output terminal 19b. The light receiving circuit 19 is grounded through the ground terminal 19b.

Since the amount of arterial blood in tissue changes due to pulses, the amount of received light of the light receiving element changes and the electric potential Vos of the signal output from the output terminal 19b also changes. The comparator 13 compares the electric potential Vdd of the output voltage of the ripple filter 11 with the electric potential Vos of the output signal of the light receiving circuit 19, and outputs a detection signal when the electric potential difference is equal to or less than a predetermined threshold value.

As in the first embodiment, when the electric potential Vdd of the output voltage of the ripple filter 11 drops due to the operation of the large current load 30 and the electric potential difference between the electric potential Vdd and the electric potential Vos of the output signal of the light receiving circuit 19 is equal to or less than the threshold value, the control circuit 14 receives a detection signal from the comparator 13 and actively reduces the gain of the amplifier circuit provided in the light receiving circuit 19. The gain reduction is performed through feedback control until no detection signal is input from the comparator 13.

As a result, the electric potential Vos of the output signal of the light receiving circuit 19 drops until the electric potential difference between the electric potential Vos and the electric potential Vdd of the power supply voltage exceeds the threshold value. Therefore, the inoperable state of the light receiving circuit 19 is avoided or eliminated immediately. Although the gain is reduced from the predetermined value, it is possible to maintain the operation of the light receiving circuit 19 even if the state of power supply voltage dropping continues. In the biological signal measurement in which continuity is strongly requested as in the present embodiment, the significance of maintaining the operation of the load is very high.

The embodiments described above are intended to facilitate understanding of the invention, and do not limit the invention. The invention may be changed or modified without departing from the spirit, and it is needless to say that the equivalents are included in the invention.

Figure 3:
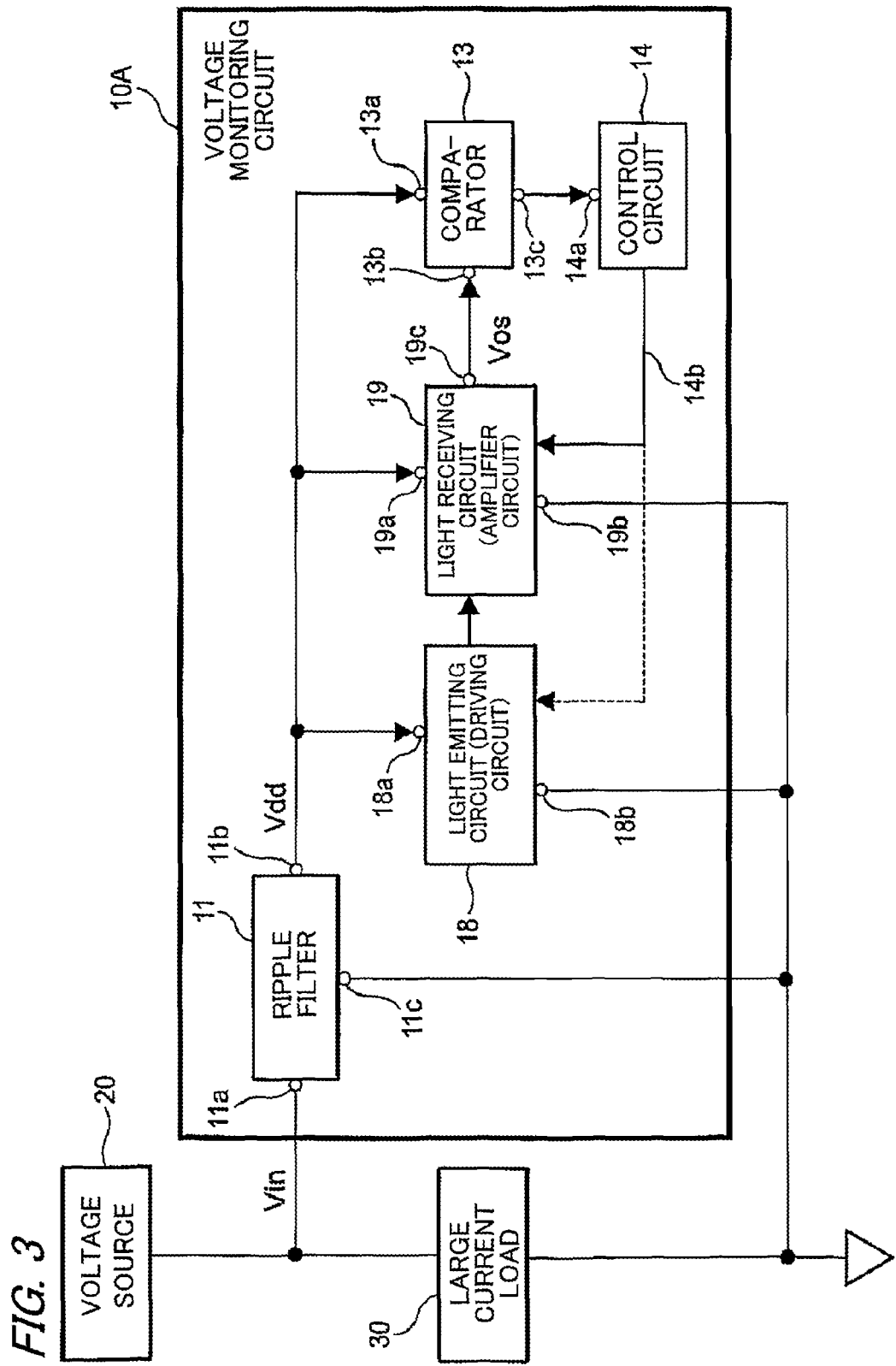
FIG. 3 is a functional block diagram showing the configuration of a voltage monitoring circuit according to a second embodiment of the invention.

As shown by dotted lines in FIGS. 1 and 3, when the detection signal from the comparator 13 is input, the electric potential Vos of the output signal of the amplifier circuit 17 (light receiving element 19 in the case of FIG. 3) may also be reduced by reducing the electric potential Vis (the amount of emitted light in the case of FIG. 3) of the input signal generated by the signal generating circuit 16. That is, the control circuit 14 may be configured to reduce at least one of the electric potential of the input signal generated by the signal generating circuit 16 and the gain of the amplifier circuit 17.

The load 12 does not necessarily need to include the amplifier circuit 17. The invention can be applied to a load that operates with the output voltage Vdd of the ripple filter 11 as its power supply voltage and that can output a predetermined signal through the operation.

The control circuit 14 may also be provided as a part of the load 12.

According to the configuration of the invention, even if a drop in the input voltage supplied to the ripple filter occurs, the load, to which the power supply voltage from the ripple filter is supplied, can be made to operate normally.

What is claimed is:

1. A voltage monitoring circuit comprising:
a ripple filter configured to output an output voltage from which a ripple component included in an input voltage, which is input from a voltage source, has been removed;
a load configured to operate with the output voltage as a supply voltage and output a first signal through the operation;
a comparator configured to compare an electric potential of the output voltage with an electric potential of the first signal and output a second signal when the electric potential difference is equal to or less than a predetermined threshold value; and
a control circuit configured to reduce the electric potential of the first signal under the condition that the second signal is input thereto,
wherein the load includes a signal generating circuit configured to generate a predetermined input signal and an amplifier circuit configured to amplify the input signal to output the first signal, and
the control circuit is configured to reduce at least one of an electric potential of the input signal and a gain of the amplifier circuit.

2. The voltage monitoring circuit according to claim 1, wherein the output voltage is less than the input voltage.

3. A voltage monitoring circuit comprising:
a ripple filter configured to output an output voltage from which a ripple component included in an input voltage, which is input from a voltage source, has been removed;
a load configured to operate with the output voltage as a supply voltage and output a first signal through the operation;
a comparator configured to compare an electric potential of the output voltage with an electric potential of the first signal and output a second signal when the electric potential difference is equal to or less than a predetermined threshold value; and
a control circuit configured to reduce the electric potential of the first signal under the condition that the second signal is input thereto,
wherein the load includes a driving circuit configured to output a driving signal to make a light emitting element emit a predetermined amount of light and an amplifier circuit configured to amplify an output signal from a light receiving element, which is output corresponding to the amount of light received from the light emitting element, and the control circuit is configured to reduce at least one of an electric potential of the driving signal and a gain of the amplifier circuit.

4. The voltage monitoring circuit according to claim 3, wherein the output voltage is less than the input voltage.

\* \* \* \* \*